United States Patent
Razeghi

(10) Patent No.: US 7,638,791 B2
(45) Date of Patent: Dec. 29, 2009

(54) INAS/GASB INFRARED SUPERLATTICE PHOTODIODES DOPED WITH BERYLLIUM

(75) Inventor: Manijeh Razeghi, Wilmette, IL (US)

(73) Assignee: MP Technologies, LLC, Evanston, IL (US)

(*) Notice: Subject to any disclaimer, the term of this patent is extended or adjusted under 35 U.S.C. 154(b) by 49 days.

(21) Appl. No.: 12/042,804

(22) Filed: Mar. 5, 2008

(65) Prior Publication Data
US 2009/0224228 A1 Sep. 10, 2009

(51) Int. Cl.
*H01L 31/00* (2006.01)
(52) U.S. Cl. .......................... 257/15; 257/28; 257/431; 257/E29.072
(58) Field of Classification Search .................. None
See application file for complete search history.

(56) References Cited

U.S. PATENT DOCUMENTS 5,384,151 A 1/1995 Razeghi
2004/0223528 A1* 11/2004 Wortman et al. .............. 372/44

OTHER PUBLICATIONS (IDS Reference 13) High differential resistance type-II InAs/GaSb superlattice photodiodes for the long-wavelength infrared Andrew Hood, Darin Hoffman, Binh-Minh Nguyen, Pierre-Yves Delaunay, Erick Michel, and Manijeh Razeghi, Appl. Phys. Lett. 89, 093506 (2006), DOI:10.1063/1.2345020.*

W.W. Anderson, Tunnel Contribution to $Hg_{1-x}Cd_xTe$ and $Pb_{1-x}Sn_xTe$ p-n Junction Diode Characteristics, Infrared Phys., 1980, pp. 353-361, vol. 20.

M.B. Reine, et al., Semiconductors and Semimetals, Chapter 6: Photovoltaic Infrared Detectors, vol. 18, Mercury Cadmium Telluride, 1981, pp. 201-311, Academic Press.

R. Adar, Spatial Integration of Direct Band-to-Band Tunneling Currents in General Device Structures; IEEE Transactions on Electron Devices, Apr. 1992, pp. 976-981; vol. 39, No. 4, a publication of the IEEE Electron Devices Society.

Y. Nemirovsky, et al., Tunneling and 1/f noise currents in HgCdTe photodiodes, Journal of Vacuum Science & Technology B, Jul./Aug. 1992; pp. 1602-1610, vol. 10, No. 4; Published for the Society by the American Institute of Physics.

C..H. Grein et al., Minority carrier lifetimes in ideal InGaSb/InAs superlattices, Applied Physics Letter, Dec. 14, 1992; pp. 2905-2907, vol. 61, No. 24, a publication of the American Institute of Physics.

(Continued)

*Primary Examiner*—Evan Pert
*Assistant Examiner*—Scott R Wilson
(74) *Attorney, Agent, or Firm*—Husch Blackwell Sanders Welsh & Katz

(57) ABSTRACT

An improved photodiode and method of producing an improved photodiode comprising doping an InAs layer of an InAs/GaSb region situated on top of an InAs/GaSb:Be superlattice and below an InAs:Si/GaSb regions such that the quantum efficiency of the photodiode increases and dominant dark current mechanisms change from diffusion to band-to-band tunneling as the InAs layer is doped with Beryllium.

9 Claims, 4 Drawing Sheets

OTHER PUBLICATIONS

F. Fuchs et al., High performance InAs/$Ga_{1-x}In_xSb$ superlattice infrared photodiodes, Applied Physics Letters, Dec. 1, 1997, pp. 3251-3253, vol. 71, No. 22, American Institute of Physics.

H. Mohseni et al., Very long wavelength infrared type-II detectors operating at 80 K; Applied Physics Letters, Sep. 11, 2000, pp. 1572-1574, vol. 77, No. 11, American Institute of Physics.

L. Burkle et al., Control of the residual doping of InAs/(Gain)Sb infrared superlattices, Applied Physics Letters, Sep. 11, 2000, pp. 1659-1661, vol. 77, No. 11, American Institute of Physics.

Y. Wei et al., Modeling of type-II InAs/GaSb superlattices using an empirical tight-binding method and interface engineering, Physical Review B, Feb. 20, 2004, pp. 085316-1 to 085316-7, published by The American Physical Society.

J.B. Rodriguez et al., MBE growth and characterization of type-II InAs/GaSb superlattices for mid-infrared detection, Journal of Crystal Growth, Jan. 15, 2005, pp. 6-13, vol. 274, Issues 1-2.

G.J. Sullivan et al., Molecular beam epitaxy growth of high quantum efficiency InAs/GaSb superlattice detectors, Journal of Vacuum Science & Technology B, May/Jun. 2005, pp. 1144-1148, vol. 23, No. 3, Papers from the 22nd North American Conference on Molecular Beam Epitaxy.

A. Hood et al., Capacitance-voltage investigation of high-purity InAs/GaSb superlattice photodiodes, Applied Physics Letters, Jan. 30, 2006, pp. 052112-1 to 052112-3, vol. 88, No. 5, American Institute of Physics.

A. Hood et al., High differential resistance type-II InAs/GaSb superlattice photodiodes for the long-wavelength infrared, Applied Physics Letters, Aug. 28, 2006, vol. 89, No. 9, American Institute of Physics.

Binh-Minh Nguyen et al., Very high quantum efficiency in type-II InAs/GaSb superlattice photodiode with cutoff of 12 um, Applied Physics Letters, Jun. 4, 2007, pp. 231108-1 to 231108-3, vol. 90, No. 23, American Institute of Physics.

* cited by examiner

INAS/GASB INFRARED SUPERLATTICE PHOTODIODES DOPED WITH BERYLLIUM

This invention was made with Government support under Grant No. HQ0006-06-C-7326 awarded by the United States Missile Defense Agency. The Government has certain rights in the invention.

FIELD OF THE INVENTION

The present invention relates generally to the field of photodiodes and more particularly to doping infrared superlattice photodiodes to improve the performance of the device.

BACKGROUND OF THE INVENTION

A superlattice (SL) is a structure consisting of closely spaced quantum wells, such that the localized discrete energy levels in the quantum wells become delocalized minibands across the entire structure, in both the conduction and valence bands. These minibands thus form an effective bandgap ($E_{ge}$) for the superlattice considered as a whole.

Type II superlattice systems are attractive to groups with both research and commercial interests because, for example, (1) the minibands of the superlattice can exhibit a lower effective bandgap than the bandgap of either constituting layer, (2) the electrons and holes are spatially separated, and (3) electrons can easily tunnel from the conduction band of one layer to the valence band of the other layer (i.e. Zener tunneling) because the energy of the conduction band of the former layer is less than the energy band of the later layer. A type II InAs/GaSb superlattice system is a particularly attractive quantum system because of its flexibility in designing the interband transitions over a wide range of wavelengths, for example, from 2 to 32 µm. Furthermore, a reduced Auger recombination rate results in small dark current at high temperatures.

However, when operating at low temperatures, for example, 77 K, the doping level is a critical parameter in determining the electrical and optical quality of a narrow gap device. The electron affinity of GaSb is approximately 4.05 eV, and the electron affinity of InAs is approximately 4.90 eV. This difference creates a broken-gap type II configuration; that is, the conduction band of the InAs stays below the valence band of the GaSb. When successive layers of GaSb and InAs are grown to form a superlattice, the electrons are attracted to the InAs layers and the holes are attracted to the GaSb layers.

Dark current mechanisms for the net transport of electrons and holes across the depletion region can be classified into two categories: (1) inherent or fundamental mechanisms, which depend only on the material properties and device design, and (2) defect-related mechanisms, which require a defect as an intermediate state. When operating at 77 K, the performance of an InAs/GaSb superlattice is limited by defect-assisted tunneling.

SUMMARY OF THE INVENTION

Doping the π-region of the active layer of a long wavelength photodiode at 77 K with Beryllium (Be) has been shown to improve the overall performance of the device. First, by switching from a residually n-type to a p-type background, the quantum efficiency of the device is increased. Second, the $R_0A$ product can linearly increase with the doping level until the point where the diodes are dominated by band-to-band tunneling. Minimization of the dark current leads to an increase of the zero-bias differential resistance from less than 4 Ω·cm$^2$ to 32Ω·cm$^2$ for a 100% cutoff of 12.05 µm.

BRIEF DESCRIPTION OF THE DRAWINGS

Various examples of objects, features and attendant advantages of the present invention will become fully appreciated as the same becomes better understood when considered in conjunction with the accompanying drawings, wherein.

DETAILED DESCRIPTION OF THE INVENTION

Figure 1:
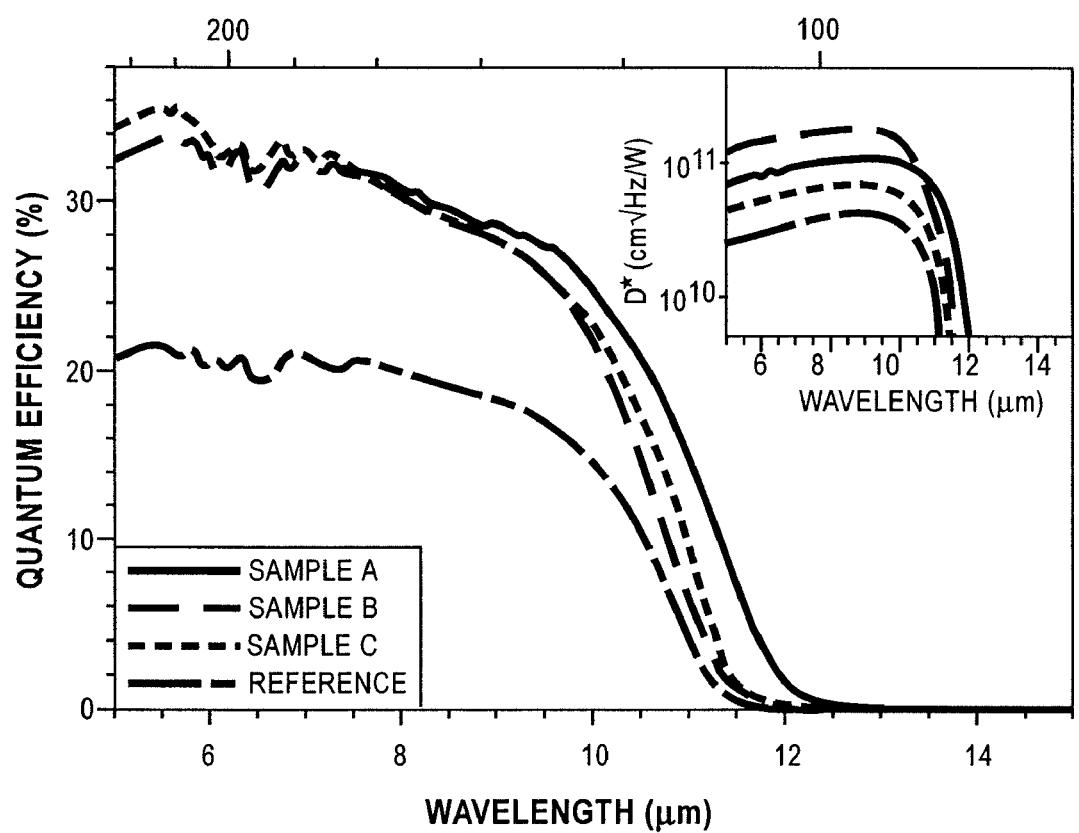
FIG. 1 shows the quantum efficiency of doped samples measured at 77 K for top-sided illuminated measurements; the inset depicts specific detectivity.

While the present invention is susceptible of embodiments in various forms, there is shown in the drawings a number of presently preferred embodiments that are discussed in greater detail hereafter. It should be understood that the present disclosure is to be considered as an exemplification of the present invention, and is not intended to limit the invention to the specific embodiments illustrated. It should be further understood that the title of this section of the present application ("Detailed Description of the Invention") relates to a requirement of the United States Patent Office, and should not be found to limit the subject matter disclosed herein.

Each of the articles cited herein is incorporated by reference. The use of the article "a" or "an" is intended to include one or more.

The foregoing description is intended as illustrative and is not to be taken as limiting. Still other variations within the spirit and scope of this invention are possible and will readily present themselves to those skilled in the art.

Type II photoconductive devices may be grown on a GaAs substrate or on InSb, InAs, Si, InP, sapphire or other materials in the $\lambda_c$=12 µm to $\lambda_c$=32 µm range operating at 80 K. Unlike HgCdTe, these detectors show excellent energy gap uniformity over a three-inch wafer area, which is important for imaging applications. A series of high performance photovoltaic type II superlattice detectors show excellent uniformity in the very long wavelength infrared ("VLWIR") range. The main advantage of photovoltaic detectors is their suitability for staring, two-dimensional focal plane array ("FPA") applications, where low current bias circuitry significantly reduces the array power and heat dissipation requirements.

Embodiments of the present invention contemplate a series of long wavelength InAs/GaSb diodes grown on GaSb. The performance of the diodes can be evaluated using current-voltage (I-V) and capacitance-voltage (C-V) measurements.

One embodiment of the present invention is directed to a type II superlattice photodiode that is grown by molecular beam epitaxy (MBE). MBE is an advanced technique for the growth of thin epitaxial layers of semiconductors, metals, or insulators. Precursor sources are generally solids which are heated above their melting points in effusion cells or gases which are connected through an injector and cracker. The sources are then evaporated in the form of beams of atoms or molecules at a controlled rate onto a crystalline substrate surface held at a suitable temperature under ultra high vacuum conditions. The epitaxial layers crystallize through a reaction between the atomic beams of the source materials and the heated substrate surface. The thickness, composition and doping level of the epilayer can be very precisely controlled via an accurate control of the atomic beam fluxes. The substrate is mounted on a block and rotated continuously to promote uniform crystal growth on its surface. The beam flux of the source material is a function of their vapor pressure which can be precisely controlled by their temperature.

The thickness, composition and other properties of the epitaxial layers and heterostructures are directly controlled by the interruption of the unwanted atomic beams with specially designed shutters. An ultra high vacuum level will ensure the beam nature of the mass flow toward the substrate. This means that the atoms will not interact with each other before reaching the substrate or that they have a mean free path longer than the distance between the source cells and the substrate. The usual distance between the orifice and the source cells and the substrate in MBE reactors is about 0.2 m, which is many orders of magnitude shorter than the mean free path of atoms or molecules (several kilometers) at the usual operating pressures in MBE ($10^{-7}$ Pa).

The most important processes in the MBE growth occur at the atomic level in the crystallization zone and can be summarized into four fundamental steps: (1) adsorption of the constituent atoms or molecules impinging on the substrate surface; (2) surface migration and dissociation of the absorbed species; (3) incorporation of the constituent atoms into the crystal lattice of the substrate or the epilayer, at a site where sufficiently strong bonding exists; and (4) thermal desorption of the species not incorporated into the crystal lattice.

The substrate used to form the structure of the photodiode of the present invention can be GaAs, Si, $Al_2O_3$, MgO, SiC, ZnO, $LiGaO_2$, $LiAlO_2$, Cd Te, SiC, InAs, InP, Ga, Sb, InSb, $MgAl_2O_4$ or GaN. Preferably, GaAs is used as the substrate. The epitaxial layer quality is sensitive to the pretreatment of the substrate and the alloy composition. Therefore, pretreatment of the substrates prior to epitaxial growth has been found to be beneficial. One such pretreatment procedure is as follows: Dipping in $H_2SO_4$ for 3 minutes with ultrasonic agitation; Rinsing in Deionized $H_2O$; Rinsing in hot methanol; Dipping in 3% Br in methanol at room temperature for 3 minutes (ultrasonic bath); Rinsing in hot methanol; Dipping in $H_2SO_4$ for 3 minutes; Rinsing in deionized $H_2O$; and Rinsing in hot methanol.

After this treatment, it is possible to preserve the substrate for one or two weeks without repeating this treatment prior to growth. Growth takes place by introducing metered amounts of the group-III alkyls and the group-V hydrides into a quartz reaction tube containing a substrate placed on an RF-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

The reactor and associated gas-distribution scheme used herein are substantially as described in U.S. Pat. No. 5,384,151, which is hereby incorporated by reference. The system comprises a cooled quartz reaction tube pumped by a high-capacity roughing pump (120 $hr^{-1}$) to a vacuum between 7 and 760 Torr. The substrate is mounted on a pyrolytically coated graphite susceptor that was heated by RF induction. The pressure inside the reactor is measured by a mechanical gauge and the temperature by an infrared pyrometer. A molecular sieve is used to impede oil back-diffusion at the input of the pump. The working pressure is adjusted by varying the flow rate of the pump by using a control gate valve. The gas panel is classical, using ¼-inch stainless steel tubes. Flow rates are controlled by mass flow control.

The reactor is purged with a hydrogen flow of 4 liters $min^{-1}$, and the working pressure of 10-100 Torr is established by opening the gate valve that separates the pump and the reactor. The evacuation line that is used at atmospheric pressure is automatically closed by the opening of the gate valve. The gas flow rates are measured under standard conditions, i.e., 1 atm and 20° C., even when the reactor is at subatmospheric pressure.

The gas sources used in this study for the growth of GaInAs and GaInP by molecular beam epitaxy are listed below.

| Group-III Sources | Group-V Source |
|---|---|
| $In(CH_3)_3$ | t-butylamine |
| $In(C_2H_5)_3$ | $NH_3$ |
| $(CH_3)_2In(C_2H_5)$ | As $(CH_3)_3$ |
| $(CH_3)_2In(C_2H_5)$ | As $(C_2H_5)_3$ |
| $Ga(CH_3)_3$ | $AsH_3$ |
| $Ga(C_2H_3)_3$ | $PH_3$ |
| | $(CH_3)_3Sb$ |
| | $(CH_2CH_3)_3Sb$ |

An accurately metered flow of purified $H_2$ for TmIn and TeGa is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure Arsine ($AsH_3$) and Phosphine ($PH_3$) are used as a source of As and P. The metal alkyl or hydride flow can be either injected into the reactor or into the waste line by using two-way valves. In each case, the source flow is first switched into the waste line to establish the flow rate and then switched into the reactor. The total gas flow rate is about 8 liters $min^{-1}$ during growth. Stable flows are achieved by the use of mass flow controllers.

Besides utilizing molecular beam epitaxy (MBE) to grow high quality III-IV materials, the subject invention may alternatively or in combination employ other forms for deposition of III-IV films. Such other forms can include for example, MOCVD (metalorganic chemical vapor deposition), MOMBE (metalorganic molecular beam epitaxy), LPE (liquid phase epitaxy), and VPE (vapor phase epitaxy).

Figure 4:
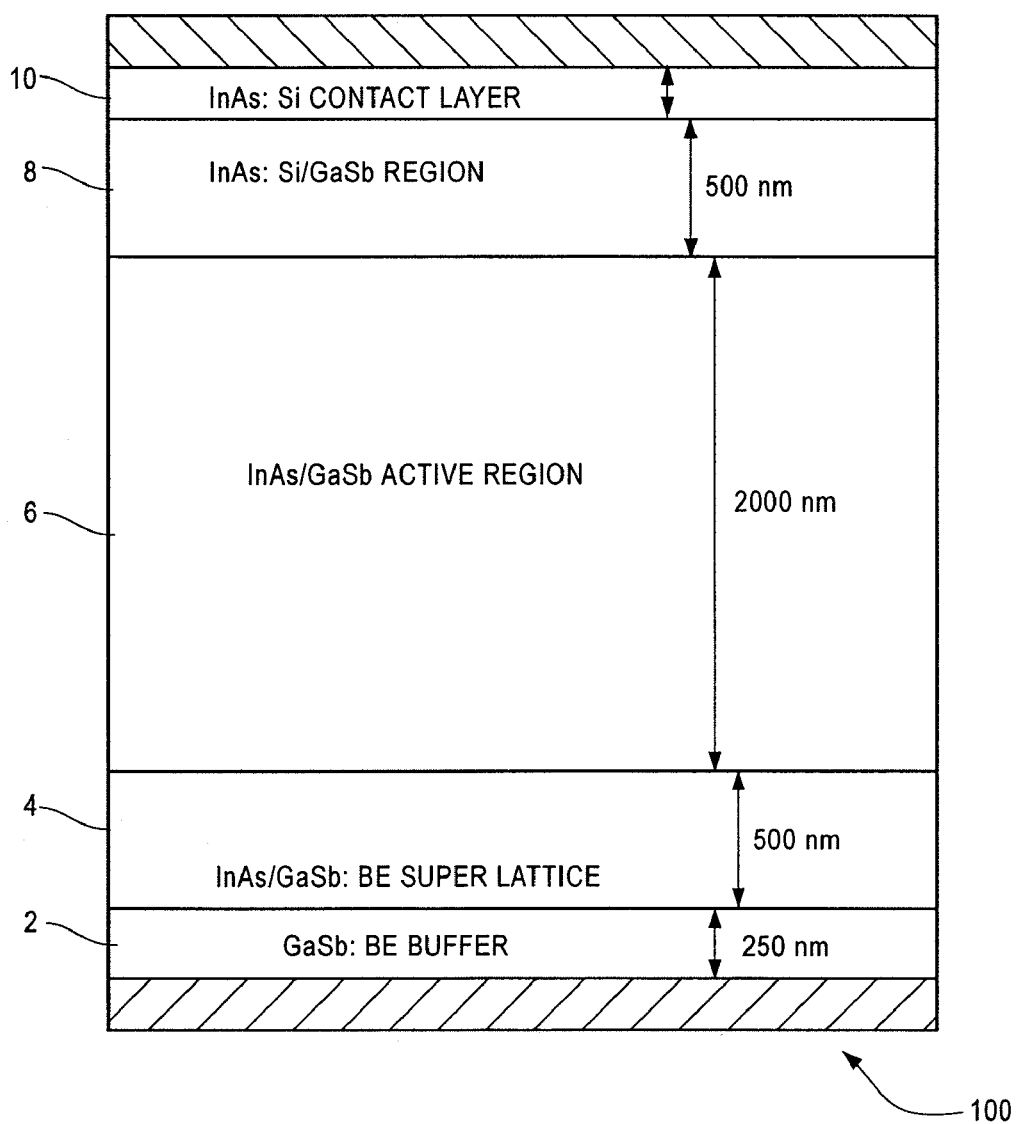
FIG. 4 shows a schematic diagram of the structure of a photodiode according to one embodiment of the present invention.

FIG. 4 is a schematic diagram of the structure of a photodiode 100 according to one embodiment of the present invention. In this embodiment, the photodiode 100 features a 250 nm thick GaSb:Be p+ buffer (p~$10^{18}$ $cm^{-3}$) 2, a 500 nm thick InAs/GaSb:Be p+ (p~$10^{18}$ $cm^{-3}$) superlattice 4, a 2000 nm thick InAs/GaSb active region 6, a 500 nm thick InAs:Si/GaSb n+ (n~$10^{18}$ $cm^{-3}$) region 8, and a thin InAs:Si n+ doped (n~$10^{18}$ $cm^{-3}$) contact layer 10. To create a reference sample, the active region can be kept undoped with a low carrier concentration due to the natural residual background of the superlattice. This background is the average of the residual p-type in GaSb and n-type in InAs layers.

The photodiode structure can be grown at 395° C. according to a calibrated pyrometer. First, a 250 nm GaSb buffer/contact layer doped with Be (p~1×10$^{18}$ cm$^{-3}$) is deposited. Then, a 500 nm thick InAs/GaSb:Be (p~1×10$^-$to 3×10$^{17}$ cm$^{-3}$) superlattice is grown followed by a 2000 nm InAs/GaSb active region. Finally, a 500 nm thick InAs:Si/GaSb (n~1×10$^{18}$ cm$^{-3}$) region is grown and capped with a thin InAs:Si (n~2×10$^{18}$ cm$^{-3}$) top contact layer. Other type-II superlattice structures may be similarly grown utilizing the binary systems of SiGe and others. Ternary systems, as in Ga$_x$In$_{1-x}$Sb/InAs and others may also be used.

On mid-wavelength photodiodes, the superlattice layer thickness makes the majority carrier more p-type because the superlattices have thicker GaSb layers relative to InAs layers. However, the present invention contemplates a long wavelength infrared design (LWIR), in which the superlattice is primarily InAs. 13 monolayers (MLs) are InAs, and 7 MLs are GaSb creating InSb forced interfaces. The background is more likely n-type.

Dominant dark current mechanisms are dependent on various factors. For example, the active region of a diode can be intentionally p-doped with beryllium (Be) in the InAs layer (called the π-region). To evaluate the effects on dark current mechanisms, several samples must be created and tested. Samples can be grown with the same design as discussed above using different beryllium cell temperatures during the π-region deposition.

Samples should be characterized with high resolution x-ray diffraction to exhibit identical patterns in each sample. Measured superlattice periods should vary from 64 to 66', and the deviation of lattice mismatch to GaSb substrate of all samples should be less than 500 ppm. All samples should be processed and characterized in exactly the same way, using standard processing techniques. The devices should not be passivated, but care should be taken to ensure minimal exposure to ambient atmospheric conditions. The analysis of each sample can be performed on sets of diodes with device areas ranging from 7.85×10$^{-5}$ to 1.26×10$^{-3}$ cm$^2$. Such measurements ensure that diodes are not dominated by surface leakages. When measuring C-V, several large diodes can be used to maximize the capacitance measured.

C-V can be measured using the Hall measurement technique. However, when InAs/GaSb is grown on a GaSb substrate, a parallel conductive channel is present, which reduces the reliability of Hall measurements. The C-V measurement technique studied in Bürkle, L., et al., *Appl. Phys. Lett.*, 77(11), 1659 (2000), which is hereby incorporated by reference, is a good alternative to the Hall measurement technique for thin film deposited on conductive substrate because it has the ability to directly measure the low level concentration in a fully processed P-I-N photodiode, rather than a test structure grown on either an alternative substrate or buffer layer. Therefore, the results and outcomes disclosed in the subject application were obtained using the C-V measurement technique studied in Bürkle, L., et al. In Table 1, E$_{g,100\%}$ is the 100% cutoff of the reference and Be-doped samples measured at 77 K. N$_{Red}$ is the measured reduced carrier concentration, and W$_{Dep}$ is the extract depletion width of each sample.

TABLE 1

| | All values measured at 77 K | | |
|---|---|---|---|
| | E$_g$, 100%(meV) | N$_{Red}$(cm$^{-3}$) | W$_{Dep}$(nm) |
| Sample A | 101.63 | 1.78 × 10$^{16}$ | 49.29 |
| Sample B | 102.81 | 7.8 × 10$^{15}$ | 74.89 |

TABLE 1-continued

| | All values measured at 77 K | | |
|---|---|---|---|
| | E$_g$, 100%(meV) | N$_{Red}$(cm$^{-3}$) | W$_{Dep}$(nm) |
| Sample C | 105.21 | 1.1 × 10$^{15}$ | 201.74 |
| Reference | 106.42 | 7.8 × 10$^4$ | 240.66 |

In Table 1, the reduced carrier concentration is extracted from fitting a linear curve to the reverse-bias voltage and the squared ratio of the area divided by capacitance.

$$(A/(CV))^2 = ((2V_{Bi})/(q\epsilon\epsilon_0 N_{Red})) - (2/(q\epsilon\epsilon_0 N_{Red}))V \quad (1)$$

In equation (1), N$_{Red}$ is the reduced carrier concentration and is defined by N$_{Red}$=(1/N$_A$+1/N$_D$)$^{-1}$. In an N$^+$–p diode the donor concentration is greater than the acceptor concentration. Therefore, N$_A$ is equivalent to N$_{Red}$. The reverse is true for a P$^+$–n diode.

A drawback to the C-V analysis is that there is no direct way to determine the polarity of the carrier background type. However, this polarity has a great influence on optical properties of the device and can be revealed from the optical spectrums. FIG. 1 shows the average quantum efficiency of the reference and doped samples contemplated in the present disclosure measured at 77 K for top-sided illuminated measurements. The increase in quantum efficiency is due to the background concentration going from n-type to p-type. The variation in cutoff wavelength is due to the slight variation in the layer thickness of each sample.

The quantum efficiency of the non-intentionally doped reference sample was 19% as 9.0 μm. Conversely, the quantum efficiency of the intentionally Beryllium-doped (Be-doped) samples was greater than 28% at 9 μm. This increase in quantum efficiency can be understood by the fact that in residually n-type material (e.g. the reference sample), the minority hole concentration dominates the photon capture efficiency. Conversely, in the Be-doped samples the minority electron concentration is dominant. The mobility of electrons, and therefore the lifetime and diffusion length for electrons, are at least an order of magnitude greater than those of holes. Thus, quantum efficiency is enhanced.

Figure 2:
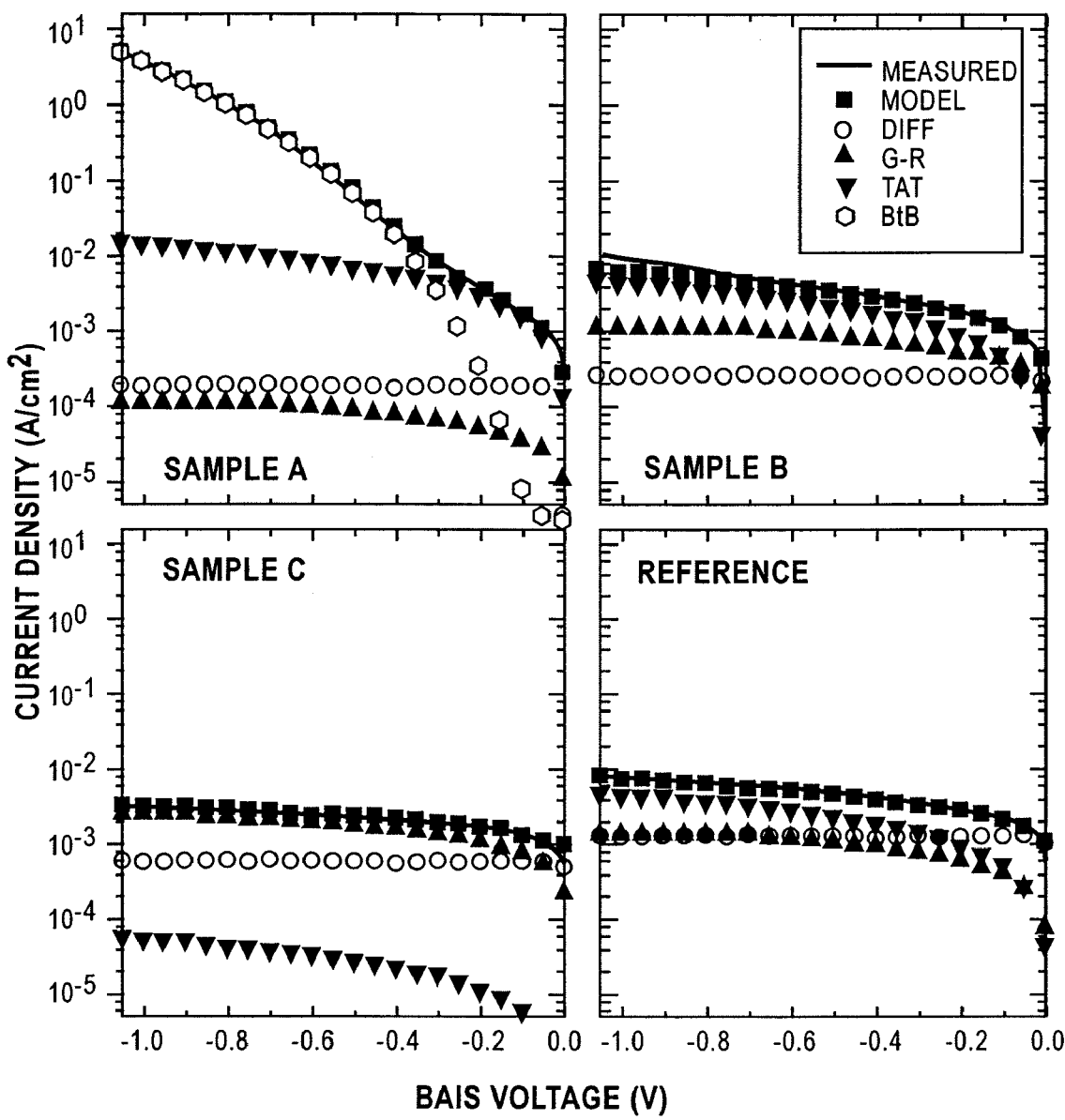
FIG. 2 shows modeled current density of the reference sample and beryllium-doped samples taking into account diffusion, generation recombination, trap-assisted tunneling, and band-to-band tunneling.

Additionally, by varying the doping level of the π-region, the mechanisms that contribute to the overall dark current are altered. FIG. 2 shows dark current modeling of the three Be-doped samples as well as the reference sample at 77 K. The four primary mechanisms taken into account are (1) diffusion, (2) generation-recombination (G-R), (3) band-to-band (Zener) tunneling, and (4) trap-assisted tunneling. In samples B and C and the reference sample, the band-to-band (Zener) tunneling current is not visible due to its negligible value. The contribution to the R$_0$A product of these tunneling currents are expressed by:

$$(R_0 A)_{Diff} = (kT/q^2)(N_{A,D}/n_i^2)(\tau_{e,h}/d) \quad (2)$$

In equation (2) n$_i$ is the intrinsic carrier density, k is the Boltzman constant, τ$_{e,h}$ is the electron (hole) lifetime, q is the electric charge, N$_{A,D}$ is the acceptor (donor) concentration, T is the temperature, and d is the p (or n) region thickness.

$$(R_0 A)_{G-R} = (V_{Bi}/(qn_i W))(\tau_{G-R}) \quad (3)$$

In equation (3) τ$_{G-R}$ is the effective generation-recombination (G-R) lifetime and W is the depletion region width at zero bias voltage. In comparison to the diffusion lifetime, the dependence of the generation-recombination (G-R) current on temperature and energy gap is linear (n$_i$) as opposed to quadratic (n$_i^2$).

$$(R_0A)_{BTB} = ((4\pi^2\hbar^2)/(q^2E))((E_{g,100\%})/(2m^*))^{1/2} \exp((4/(3qh))\sqrt{(\epsilon_s m^* E_{g,100\%} N_{Red}^{-1})}) \quad (4)$$

In equation (4), E is the electric field, $\epsilon_s$ is the dialectic constant of the superlattices, $m^*$ is the electron effective mass, and $E_{g,100\%}$ is the 100% cutoff of the photodiode at 77 K.

Due to defect levels within the depletion region, trap-assisted tunneling has a quite complicated expression. In the dark current modeling of FIG. 2, the trap-assisted tunneling is used to fit the total dark current, including the surface leakage. The total dark current can change from one sample to the next, but the variation is more likely due to the fluctuation in processing steps or the diodes' respective sizes rather than any actual change of the inner properties of the materials.

Theoretically, the total dark current value depends mostly upon the trap density and the tunneling rate of the electrons. Both the trap density and the tunneling rate of the electrons can be varied by improving material quality and processing, but neither is directly related to doping level. In the present disclosure, the contribution of trap-assisted tunneling is considered a constant factor in all samples.

As shown in equations 2-4 and FIG. 2, as the doping level is increased, the diffusion current decreases and its contribution to the $R_0A$ product increases proportionally. As the doping level is increased, the generation-recombination (G-R) current also decreases because the depletion width decreases. This leads to an increase of the $(R_0A)_{G-R}$.

Figure 3:
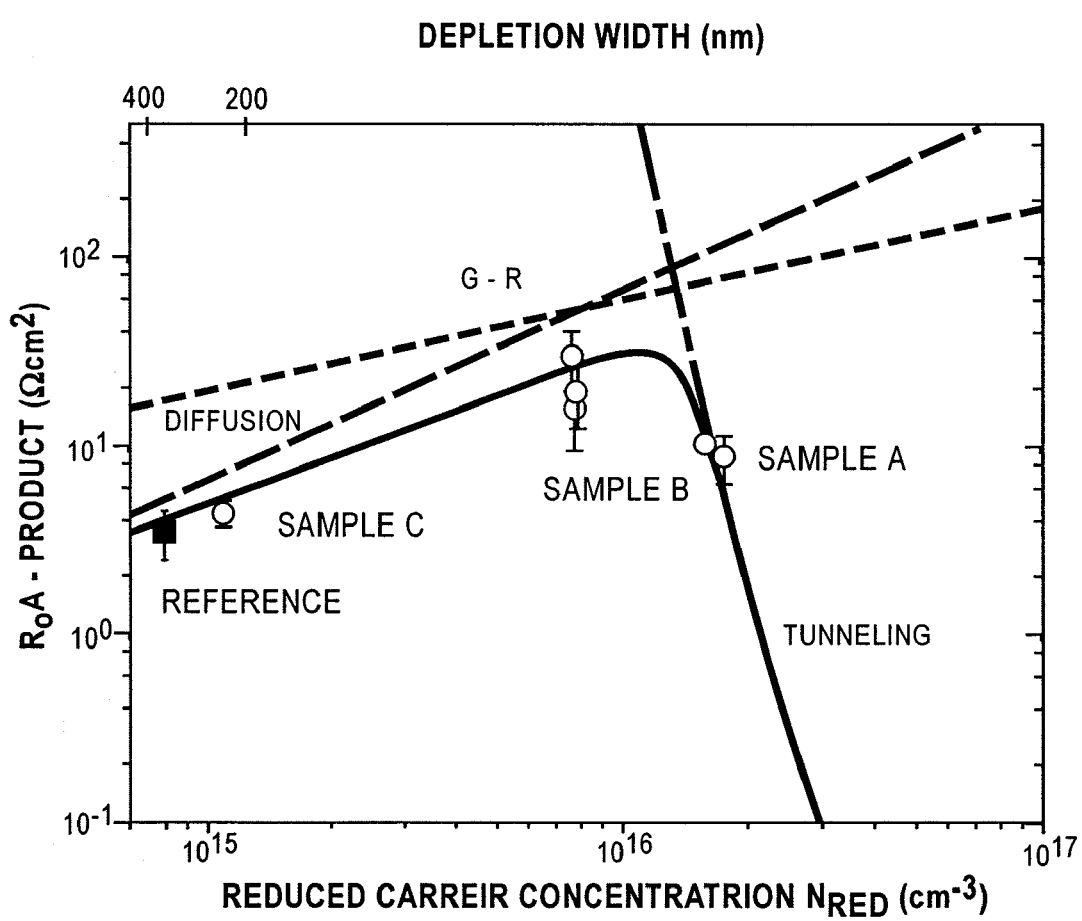
FIG. 3 shows the experimentally determined dynamical impedance at zero bias voltage and 77 K.

$R_0A$ has been observed to be temperature dependent such that a linear relation between $1/R_0A$ and $1/T$ exists at temperatures as low as 50 K. Therefore, the generation-recombination (G-R) current does not exist until temperatures dip to an extremely low level. At zero bias and at 77 K, the $(R_0A)_{G-R}$ is often orders of magnitude higher than $(R_0A)_{Diff}$. Therefore, the only two competing factors to the $R_0A$ are diffusion and tunneling. The $(R_0A)_{BTB}$ decreases as the doping level is increased. At a certain point the $(R_0A)_{BTB}$ is comparable to the $(R_0A)_{Diff}$. Thus, tunneling behavior is exhibited, and the device is no longer limited by the diffusion mechanism. The evolution of the tunneling and diffusion mechanisms as the doping level varies is shown in FIG. 3. The dashed lines represent diffusion, generation-recombination, and band-to-band (Zener) tunneling components. The solid line is the cumulative theoretical value of the $R_0A$ product.

Dark current modeling determined average lifetimes of 83 ns for the electron diffusion lifetime and 33 ns for the generation-recombination (G-R) lifetime. Use of these values allowed experimental data to match perfectly with the theoretical prediction (solid line) shown in FIG. 3. A maximum differential resistance at zero-bias ($R_0A$) of 35 $\Omega \text{cm}^2$ is expected for a diode with $\lambda_{0\%}=12.2$ μm at 77 K with $N_A=1.1 \times 10^{16}$ cm$^{-3}$.

What is claimed:

1. An InAs/GaSb photodiode comprising:
   a GaSb:Be buffer;
   an InAs/GaSb:Be superlattice;
   an InAs/GaSb active region;
   an InAs:Si/GaSb region; and
   an InAs:Si contact layer
   wherein the InAs/GaSb active region is doped with Beryllium in the InAs layer such that quantum efficiency of the photodiode increases and a dominant dark current mechanism changes from diffusion to band-to-band tunneling as the InAs layer is doped with the Beryllium.

2. The photodiode of claim 1 wherein the GaSb:Be buffer is 250 nm thick, the InAs/GaSb:Be superlattice is 500 nm thick, InAs/GaSb region is 2000 nm thick, the InAs:Si/GaSb region is 500 nm thick, and the InAs:Si contact layer is thin.

3. The photodiode of claim 1 wherein the quantum efficiency increases up to 28%.

4. The photodiode of claim 1 wherein electron mobility is increased at least an order of magnitude greater than hole mobility.

5. The photodiode of claim 1 wherein electron lifetime is increased at least an order of magnitude greater than hole lifetime.

6. The photodiode of claim 1 wherein electron diffusion length is increased at least an order of magnitude greater than hole diffusion length.

7. The photodiode of claim 1 wherein a minority electron concentration dominates.

8. The photodiode of claim 1 wherein diffusion current decreases as the InAs layer is doped with Beryllium.

9. The photodiode of claim 1 wherein a contribution of the diffusion current to an $R_0A$ product increases proportionally as the InAs layer is doped with Beryllium.

* * * * *

UNITED STATES PATENT AND TRADEMARK OFFICE
CERTIFICATE OF CORRECTION

PATENT NO. : 7,638,791 B2 Page 1 of 1
APPLICATION NO. : 12/042804
DATED : December 29, 2009
INVENTOR(S) : Manijeh Razeghi It is certified that error appears in the above-identified patent and that said Letters Patent is hereby corrected as shown below:

Column 1, line 3, insert:

--This invention was made with Government support under Grant No. W15P7T-08-C-M001 awarded by the Commander US Army CECOM. The Government has certain rights in the invention.--

Signed and Sealed this

Thirtieth Day of March, 2010

David J. Kappos
*Director of the United States Patent and Trademark Office*